(12) United States Patent
Zhu et al.

(10) Patent No.: US 8,829,962 B2
(45) Date of Patent: Sep. 9, 2014

(54) SUB-GATE DELAY ADJUSTMENT USING DIGITAL LOCKED-LOOP

(71) Applicants: Ning Zhu, Belmont, MA (US); Hajime Shibata, Toronto (CA)

(72) Inventors: Ning Zhu, Belmont, MA (US); Hajime Shibata, Toronto (CA)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/177,582

(22) Filed: Feb. 11, 2014

(65) Prior Publication Data

US 2014/0159805 A1    Jun. 12, 2014

Related U.S. Application Data

(62) Division of application No. 13/629,974, filed on Sep. 28, 2012, now Pat. No. 8,704,568.

(51) Int. Cl.
   *H03L 7/06*    (2006.01)

(52) U.S. Cl.
   USPC .......................................... 327/158; 327/149

(58) Field of Classification Search
   USPC ......................................................... 327/158
   See application file for complete search history.

(56) References Cited

U.S. PATENT DOCUMENTS

| | | | | |
|---|---|---|---|---|
| 6,163,184 | A * | 12/2000 | Larsson ......................... | 327/156 |
| 7,486,214 | B1 * | 2/2009 | Di Giandomenico et al. ............................. | 341/143 |
| 8,199,038 | B2 * | 6/2012 | Kim et al. ...................... | 341/143 |
| 2001/0030572 | A1 * | 10/2001 | Liang et al. .................... | 327/536 |
| 2003/0048126 | A1 * | 3/2003 | Watarai ......................... | 327/536 |
| 2004/0041603 | A1 | 3/2004 | Abidin et al. | |
| 2004/0113667 | A1 | 6/2004 | Jin | |
| 2006/0252397 | A1 * | 11/2006 | Boecker et al. ................ | 455/260 |
| 2008/0088350 | A1 * | 4/2008 | Sohn .............................. | 327/175 |
| 2008/0089459 | A1 * | 4/2008 | Vlasenko et al. .............. | 375/376 |
| 2008/0309386 | A1 * | 12/2008 | Vlasenko ....................... | 327/157 |
| 2009/0102689 | A1 * | 4/2009 | Di Giandomenico et al. ............................. | 341/118 |
| 2009/0121908 | A1 * | 5/2009 | Regier ........................... | 341/142 |
| 2009/0189654 | A1 * | 7/2009 | Clements et al. .............. | 327/157 |
| 2010/0066420 | A1 * | 3/2010 | Kaneko ......................... | 327/157 |
| 2010/0085094 | A1 * | 4/2010 | Ma ................................ | 327/158 |
| 2010/0090734 | A1 * | 4/2010 | Eker .............................. | 327/157 |
| 2010/0156534 | A1 * | 6/2010 | Kim et al. ..................... | 330/254 |
| 2011/0025537 | A1 * | 2/2011 | Kim et al. ..................... | 341/143 |

(Continued)

FOREIGN PATENT DOCUMENTS

| | | | | |
|---|---|---|---|---|
| JP | 2003-087115 | | 3/2003 | |
| JP | 2003087115 A | * | 3/2003 | .............. H03L 7/093 |
| WO | 2005/022752 A1 | | 3/2005 | |

OTHER PUBLICATIONS

European Search Report dated Dec. 13, 2013 issued in corresponding European Application No. 13185823.5, 6 pages.

*Primary Examiner* — Adam Houston
(74) *Attorney, Agent, or Firm* — Kenyon & Kenyon, LLP

(57) ABSTRACT

A delay locked loop (DLL) includes a delay line that delays a clock signal to generate a delayed clock signal, a phase frequency detector (PFD) for detecting a phase and/or frequency difference between the clock signal and the delayed clock signal, and a charge pump having an adjustable bias current for converting the phase and/or frequency difference taking into account a bias current adjustment into a control voltage, in which the control voltage controls an amount of delay in the delayed clock signal.

15 Claims, 9 Drawing Sheets

430

(56) References Cited

U.S. PATENT DOCUMENTS

| | | |
|---|---|---|
| 2011/0163786 A1* | 7/2011 | Ma .............................. 327/153 |
| 2011/0199152 A1* | 8/2011 | Swei et al. .................. 327/538 |
| 2011/0215849 A1* | 9/2011 | Wadhwa et al. ............. 327/157 |
| 2012/0146692 A1* | 6/2012 | Yun .............................. 327/157 |
| 2013/0003483 A1* | 1/2013 | Vlasenko et al. ........ 365/230.02 |
| 2014/0091954 A1* | 4/2014 | Zhu et al. .................... 341/110 |

* cited by examiner

420

410

430

450

440

SUB-GATE DELAY ADJUSTMENT USING DIGITAL LOCKED-LOOP

CROSS-REFERENCE TO RELATED APPLICATIONS

This application is a divisional of U.S. patent application Ser. No. 13/629,974 filed on Sep. 28, 2012, the entirety of which is herein incorporated by reference.

FIELD OF THE INVENTION

The present invention is generally directed to analog-to-digital converters (ADCs), in particular, to methods and apparatus that may control time delays in clocks supplied to a continuous time sigma-delta (CTSD) modulator.

BACKGROUND INFORMATION

With the advance of semiconductor technology, the emergence of deep sub-micron or nanometer technologies allows analog designers to design with ever faster transistors, thereby enabling the implementation of high-speed circuitries and systems. In the case of a CTSD modulator, the finer geometry (such as 65 nm) transistors allow for multi-GHz sampling clock frequency. Because of this, the input signal bandwidth that the ADC can handle is also boosted dramatically, which may introduce additional sensitivity to clock skews.

FIG. 1 is a CTSD modulator 10 which includes an input terminal 12, a summation block 14, a loop filter 16, a flash analog-to-digital converter (flash) 18, an optional delay locked-loop (DLL) 20, a digital-to-analog converter (DAC) 22, and an output terminal 24, where the summation block 14 may be part of the loop filter 16. The input terminal 12 receives an analog signal that the CTSD modulator 10 converts into a digital signal at the output terminal 24. Referring to FIG. 1, the modulator ADC 10 includes a forward signal path from the input terminal 12 to output terminal 24, including serially connected the summation block 14, loop filter 16, and ADC 18, and a feedback signal path from the output terminal 24 to the input terminal 12, including the DAC 22. DLL 20 receives a clock signal and outputs aligned clocks to the ADC 18 and DAC 22 to drive both blocks. The summation block 14 is configured as a subtractor that subtracts the output of DAC 22 from the input signal to generate a residual signal that is fed to an input of loop filter 16. The loop filter 16 may be a low-pass filter or bandpass filter for smoothing the residual signal which ADC 18 may convert into a digital output at output terminal 24. The digital output is fed into an input of DAC 22 which converts the digital output into analog form to be compared with the input signal.

The two major circuit blocks, ADC 18 and DAC 22, are driven by clocks generated from DLL 20. During operation, the clocks fed into ADC 18 and DAC 22 may include timing differences. For example, referring to FIG. 1, ADC 18 may perform signal sampling at time instant 26, or the rising edge of a first clock cycle, while the DAC 22 may perform digital-to-analog conversion over time period 28 which starts at the rising edge of a second clock cycle that follows the first clock cycle. Ideally, the time instant 26 and the outset of the time period 28 should happen at the same time. However, in practice, a time difference between these two may exist, which may introduce phase shifts in the frequency domain. The phase shift may be detrimental to the stability of high-order loop filters 16 contained in the feedback path.

Therefore, before the CTSD modulator is shipped to a customer, the clock skew between these two major blocks may be tuned to correct or compensate for the high order effects. The clock to the ADC 18 may be either delayed or advanced to match the clock to DAC 22. Delaying the clock to ADC 18 flattens the noise transfer function (NTF) of the CTSD modulator 10, while advancing the clock would reduce the meta-stability of ADC 18. Therefore, it is desirable that the timing difference between ACD 18 and DAC 22 can be fine-tuned to the degree of a few percentage of the clock period. For example, for certain applications, the delay needs to be below 5 ps which is finer or shorter than a simple inverter can achieve. For faster CTSD converters, the capability of sub-gate delay adjustment is very important.

Current art uses phase interpolation to generate sub-gate delays. FIG. 2 illustrates a DLL that uses phase interpolation to generate sub-gate delay. The DLL 30 includes a delay line 32 which includes a phase interpolator 34, a phase lock element 42 that includes a phase frequency detector 36, a charge pump 38, and a loop filter 40, a DAC pulse driver 44, and a flash clock driver 46. Additionally, DLL 30 includes a plurality of multiplexers 48, 50. To overcome sub-gate delay variations caused by manufacturing, supplying voltage, and operating temperature variation (PVT), closed loop (DLL) is commonly used. Referring to FIG. 2, a source clock is supplied to the delay line 32 in which the phase interpolation circuit 34 may generate delays between two clock outputs. The closed loop locks the input clock and the output of the dummy multiplexer 50. In practice, since DAC 22 requires a clean clock that has little jitters, the first clock output passes through a dummy multiplexer 50 and is supplied to the phase lock element 42 at which the first clock output is phase locked with the source clock before supplied to the DAC pulse driver 44. In the phase lock element 42, the phase frequency detector 36 detects phase and frequency difference between the source clock and the output of the dummy multiplexer 50. The charge pump 38 converts the phase difference into a voltage signal that is low-pass filtered by the loop filter 40. The output from the loop filter 40 is the control voltage that is fed back into the delay line 32 including delay elements. DAC driver 44 supplies a clock signal to the DAC 22. The second clock output from the delay line 32 include multiple delay lines generated by phase interpolator 34. These delay lines are supplied to multiplexer 48 that is controlled by a digital input. By adjusting the digital input, the second clock output with a different amount of phase delay is supplied to flash ADC clock driver 46 which drives the ADC 18.

In order to tap out the different phase delays generated by the phase interpolator 34, many levels of multiplexers are needed. The wider the adjustable range and the finer the timing resolution are, the more multiplexers are needed. However, multiplexers need to be matched to each other. Therefore, multiple multiplexers in CTSD modulators increase the difficulties of circuit design.

Another challenge for nanometer circuitry is low voltage supply, which may be as low as 1V for certain designs.

DETAILED DESCRIPTION OF EXAMPLE EMBODIMENTS

There are needs for a CTSD modulator that includes a DLL that uses few or no multiplexers for adjusting clock delays. Further, the DLL needs to take into consideration ease to adjust the phase in fine delay resolution (few percent of clock period), low headroom circuitry, and low sensitivity to PVT variations.

Embodiments of the present invention may include a delay locked-loop (DLL) that includes a delay line that delays a clock signal to generate a delayed clock signal, a phase frequency detector (PFD) for detecting a phase and/or frequency difference between the clock signal and the delayed clock signal, and a charge pump having an adjustable bias current for converting the phase and/or frequency difference taking into account a bias current adjustment into a control voltage, in which the control voltage controls an amount of delay in the delayed clock signal.

Embodiments of the present invention may include a continuous time sigma-delta (CTSD) that may include an ADC, a DAC and a DLL for generating clocks to drive the ADC and DAC, in which the DLL may include a delay line that delays a clock signal to generate a delayed clock signal, a phase frequency detector (PFD) for detecting a phase and/or frequency difference between the clock signal and the delayed clock signal, and a charge pump having an adjustable bias current for converting the phase and/or frequency difference taking into account a bias current adjustment into a control voltage, in which the control voltage controls an amount of delay in the delayed clock signal.

Figure 1:
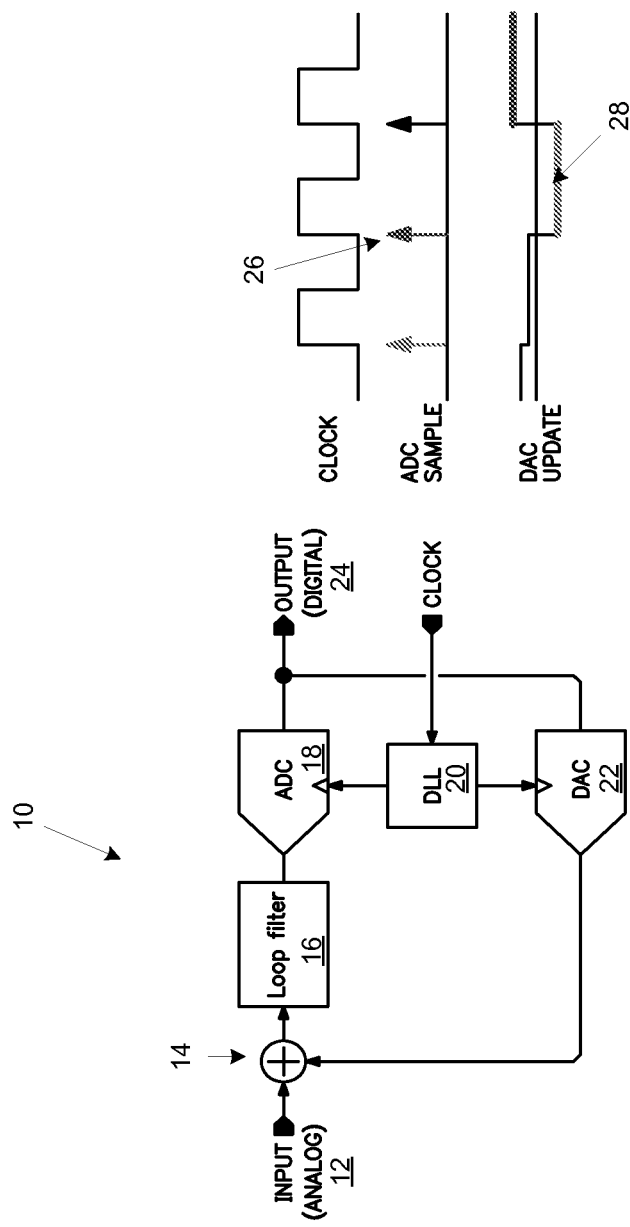
FIG. 1 illustrates a continuous time sigma-delta (CTSD) modulator and its driving clocks.
Figure 2:
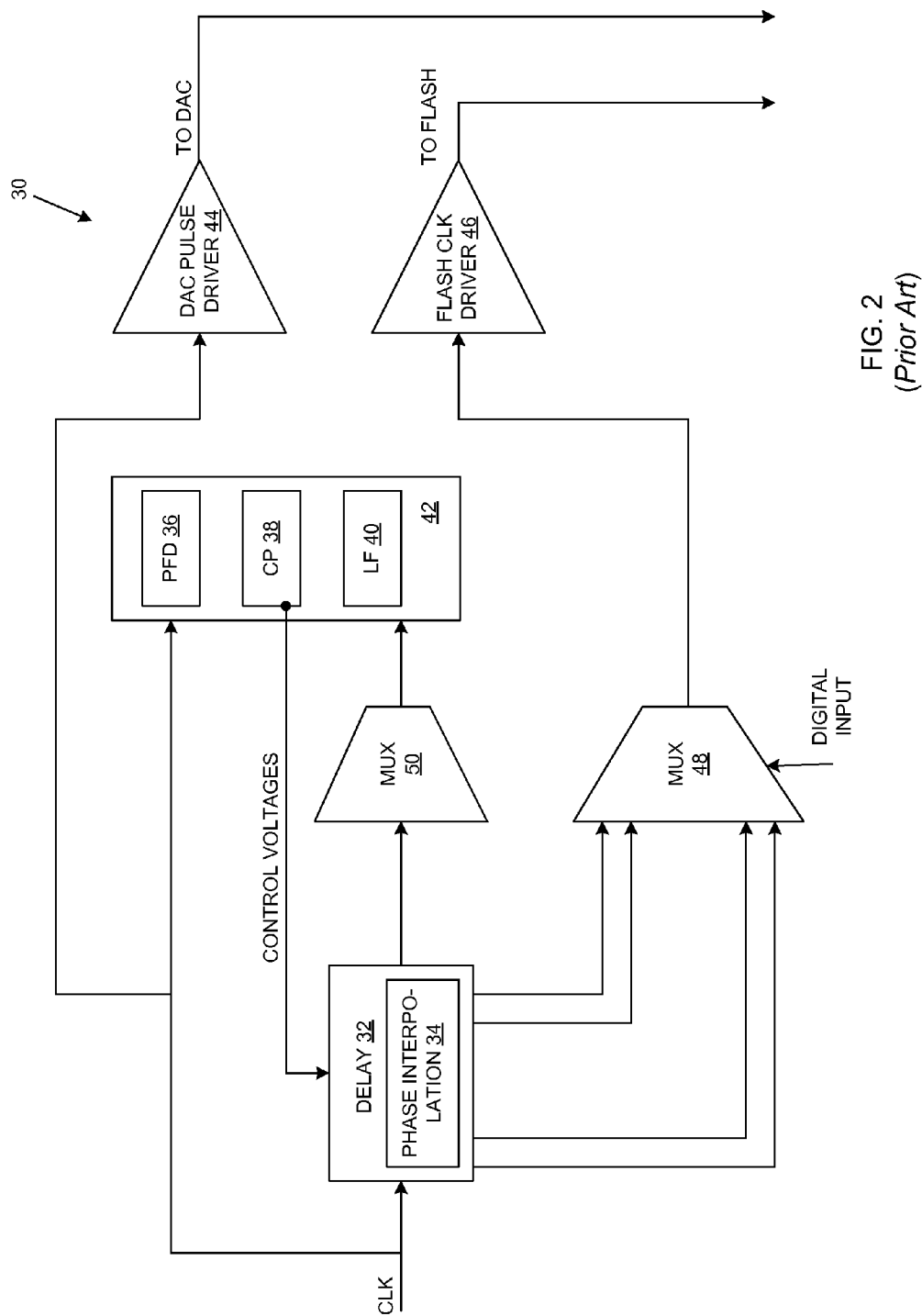
FIG. 2 illustrates a delay locked-loop circuit (DLL) that uses multiplexers to adjust clock delays.
Figure 3:
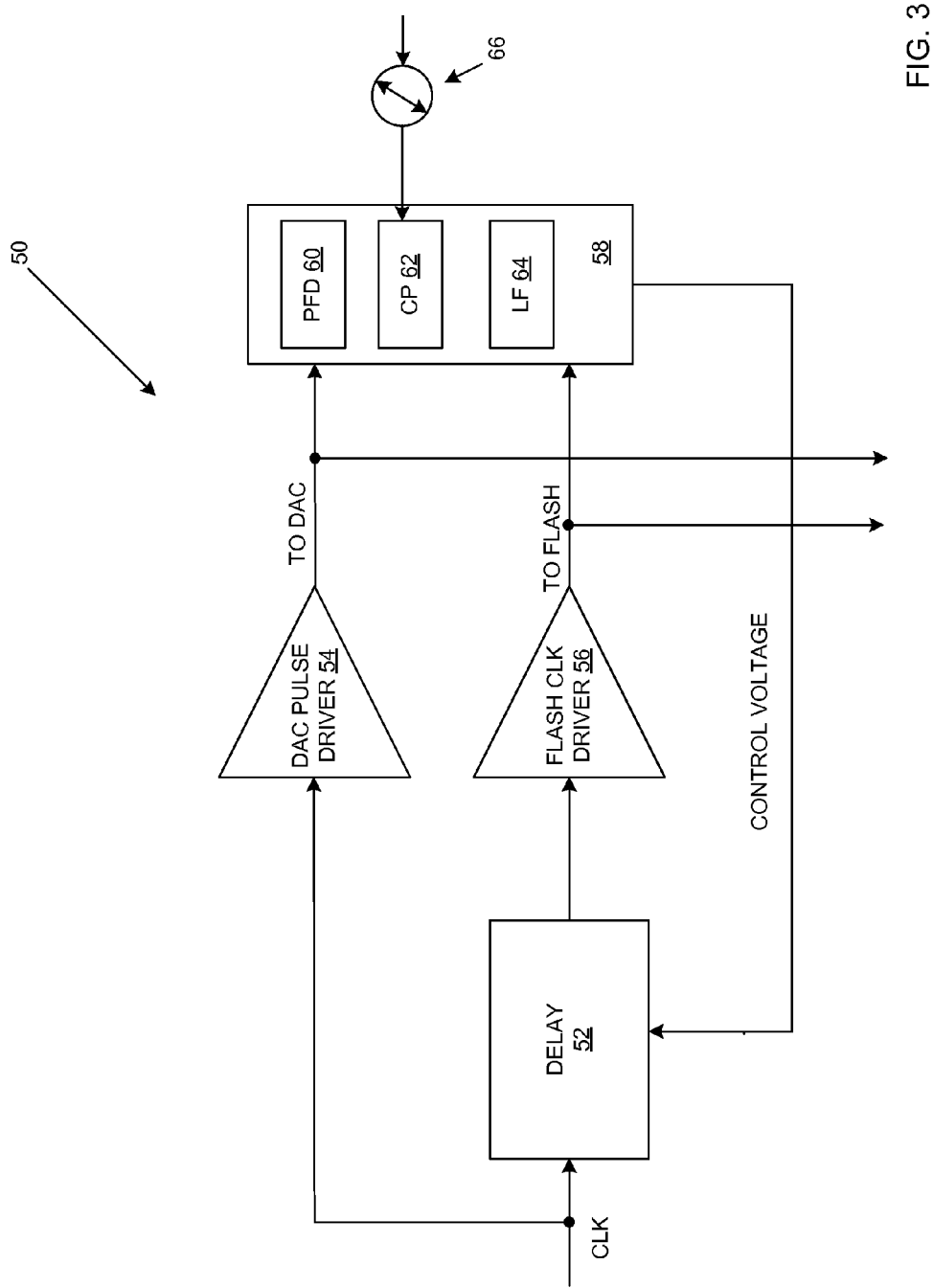
FIG. 3 illustrates a DLL according to an embodiment of the present invention.

FIG. 3 is a DLL that outputs two clock outputs whose phase difference may be adjusted through a current input according to an embodiment of the present invention. The DLL 50 as shown in FIG. 3 may supply a first clock output to a DAC in a CTSD modulator and a second clock output to a flash ADC in the CTSD, in which the phase difference between the first and second clock outputs is conveniently adjustable through a tunable current injection. Referring to FIG. 3, DLL 50 may include a delay line 52, a DAC pulse driver 54, a flash ADC clock driver 56, and a phase lock element 58 which may further include a phase frequency detector 60, a charge pump 62, and a loop filter 64. The charge pump 62 may have an input for receiving the tunable current injection 66.

In one embodiment of the DLL 50, delay line 52 may include an input terminal for receiving a source clock, an output terminal for outputting a clock output that is a delayed version of the source clock, and control terminals for receiving an adjustment voltage which may be adjusted to control the amount of delay in the clock output. The DAC pulse driver 54 may include an input terminal for receiving the source clock and an output terminal for supplying the source clock to the DAC and to a first input terminal of the phase frequency detector 60. The flash ADC clock driver 56 may include an input terminal coupled to the output terminal of the delay line 52 for receiving the delayed source clock and an output terminal for supplying the delayed source clock to the flash ADC and to a second input terminal of the phase frequency detector 60. The phase frequency detector 60 may detect a phase and/or frequency difference between the signals at the first and second terminals and output the phase and/or frequency difference to the charge pump 62. The charge pump 62 may also include an additional control input terminal for receiving the tunable current injection 66 to insert an offset current intended by a user. The charge pump 62 may convert the phase and/or frequency difference into a voltage signal indicating the difference taking into consideration of the tunable current injection 66. By intentionally injecting current into the charge pump 62, a phase skew may be inserted into the clock to the flash ADC. The loop filter 64 may smooth the voltage output from the charge pump 62 and supply the smoothed output to the control terminal of the delay line 52.

In operation, if there is no current injection to the charge pump, the clock to the DAC and the clock to the flash ADC are phase-locked through the feedback loop to the control terminal of the delay line 52. However, if there is current injection to the charge pump, a phase skew between the clock to the DAC and the clock to the flash ADC may be intentionally generated. Thus, by controlling the amount of the tunable current injection 66 at the charge pump 62, the phase skew between the clock to the DAC and the clock to the flash ADC may be adjusted.

Embodiments of the present invention as shown in FIG. 3 may control the phase skew through current injection without the need for a phase interpolator and multiplexers. Further, embodiments of the present invention directly compare the timing difference between the two clocks to the DAC and the flash ADC, thereby reducing the DLL's sensitivity to PVT.

Embodiments of the present invention may include a PFD 60 that may include two dynamic latches and a feedback AND gate that may reset the two latches. When the two latches are locked in a steady state, the PFD may output an up (UP) pulse at an output of the first latch and a down (DN) pulse at an output of the second latch. If there is no current mismatch between the bias currents of the UP and DN branches, the UP and DN pulses match, or rise at the same time and have the same pulse width. However, if there is current mismatch, the UP and DN pulses may be skewed and may have different pulse widths. The charge pump 68 may translate the problem of matching the timing of UP and DN pulses into a current matching problem.

Figure 4B:
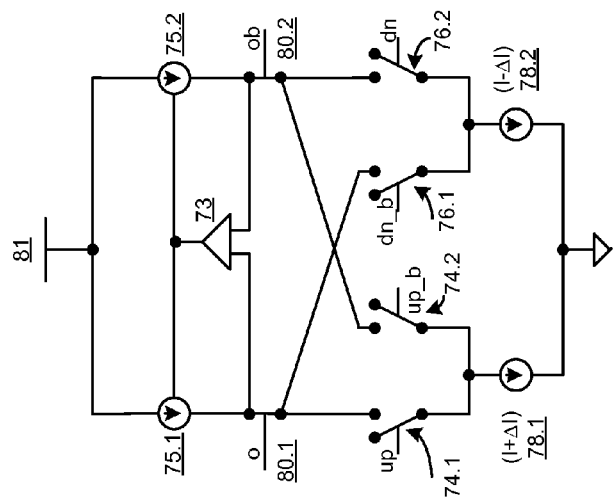
FIGS. 4A-4E illustrate charge pumps according to embodiments of the present invention.
Figure 4A:
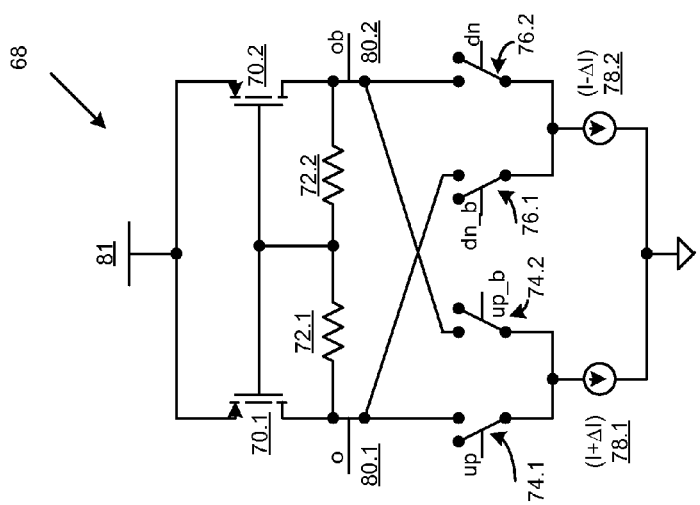

Embodiments of the present invention may include different forms of charge pumps that may convert the timing mismatches into a current matching problem. FIG. 4A is a charge pump 68 according to an embodiment of the present invention. As shown in FIG. 4A, the charge pump 68 may include a pair of MOS transistors 70.1, 70.2, a pair of resistors 72.1, 72.2, a first pair of switches 74.1, 74.2, a second pair of switches 76.1, 76.2, a pair of current sources 78.1, 78.2, and output nodes 80.1, 80.2. In one embodiment, the pair of MOS transistors may be PMOS transistors whose sources may be coupled to a voltage supply 81, whose gates may be coupled together, and whose drains may be coupled to the output nodes 80.1, 80.2. Resistor 72.1 may be coupled between the gate of PMOS 70.1 and the output node 80.1, and resistor 72.2 may be coupled between the gate of PMOS 70.2 and the output node 80.2. The first switches 74.1, 74.2 respectively may be coupled between current source 78.1 and output nodes 80.1, 80.2, respectively. The first pair of switches may be controlled by the UP pulse from PFD 60. The UP pulse triggers switch 74.1 and the inverted UP pulse triggers switch 74.2. The second pair of switches may be controlled by the DN pulse from the PFD 60. The DN pulse triggers switch 76.2 and the inverted DN pulse triggers switch 76.1.

According to the embodiment as shown in FIG. 4A, the charge pump 68 may accommodate low voltage supply 81.

One known approach to allowing fast switching frequency is H-bridge technology. Unfortunately, H-bridge technology suffers from the problem of insufficient headroom. In the embodiment as shown in FIG. 4A, the charge pump 68 uses resistors 72.1, 72.2 across the output nodes 80.1, 80.2 to provide DC bias for PMOS transistors 70.1, 70.2. This self-biased scheme removes the concern for current matching between NMOS and PMOS current sources as used in the H-bridge technology.

Figure 4C:
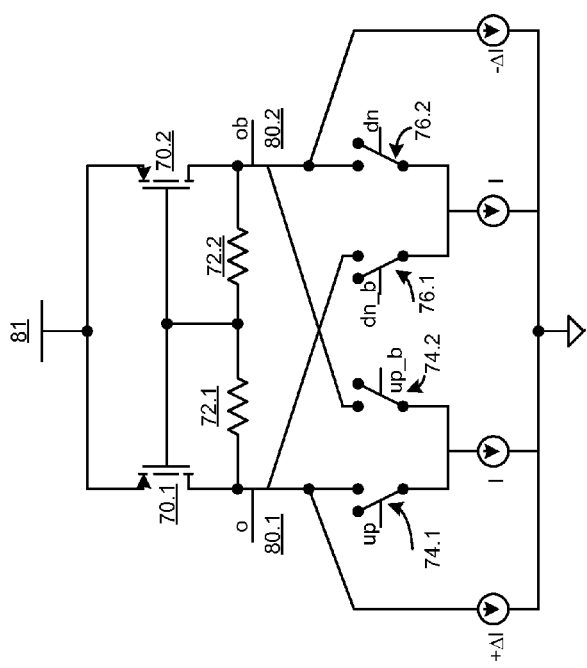
Figure 4E:
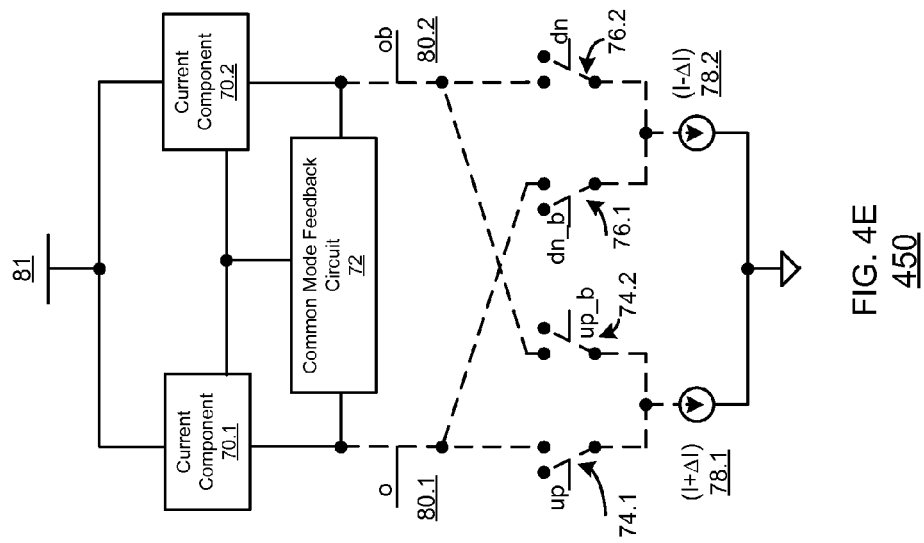
Figure 4D:
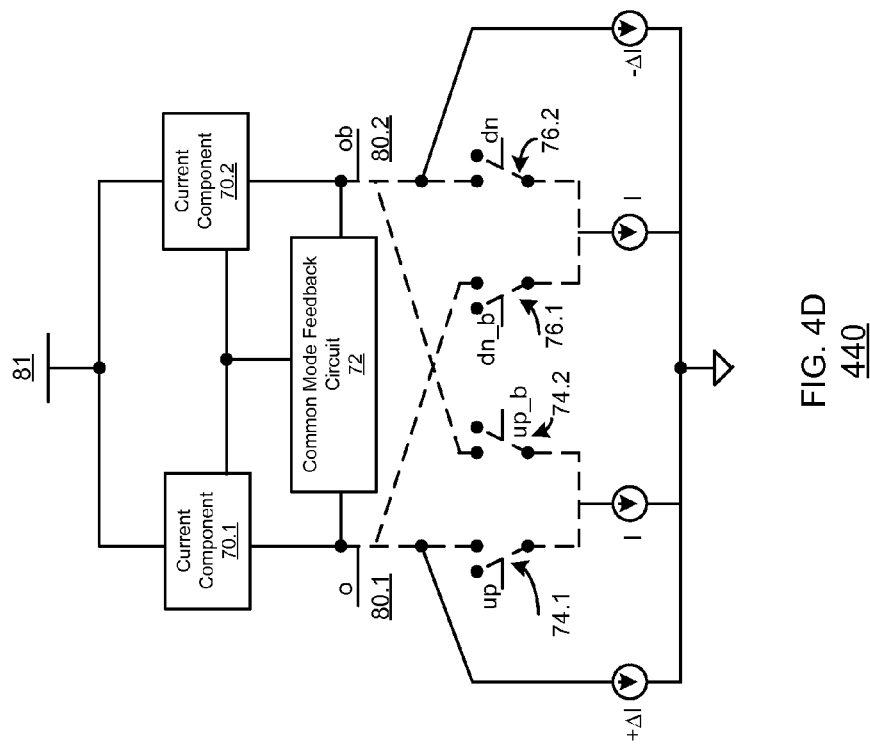

FIGS. 4D and 4E show further embodiments of a charge pump according to the present invention. The charge pump 440 shown in FIG. 4D may be a generalized version of the charge pump 430 shown in FIG. 4C. The charge pump 450 shown in FIG. 4E may be a generalized version of the charge pump 410, 420 shown in FIGS. 4A and 4B. The components of each of charge pumps 440 and 450 are the same and have the same functions as corresponding components described with respect to FIG. 4A, unless otherwise described herein. Each of the charge pumps 440 and 450 may include a first portion, which may include one or more fixed current components 70.1, 70.2 with common mode bias circuits. Each of charge pumps 440 and 450 may further include a second portion, which may include switching structures 74 and 76 and tunable offset currents I±ΔI. The first portion and the second portion may be joined by and coupled to output nodes 80.1, 80.2. The second portion may be directly or switchably connected to the first portion. For example, all or some of the dashed switching paths may be replaced by direct connections without switches such that the tunable offset currents are directly connected to the output nodes, e.g., without switches or with switches always turned on.

Since the supply is low, it is preferable that the output voltages do not swing much. Also, the output nodes may need to have equal potential to minimize unwanted offsets caused by current mismatches in charge pump 68. In one embodiment, outputs of the charge pump 68 may be coupled to an active loop filter (not shown), which may clamp voltages at the output nodes 80.1, 80.2 and keep them at the same voltage level (if the gain of the active filter is large enough). In one embodiment as shown in FIG. 4A, the self-biased PMOS transistors are HVT (high-threshold voltage) devices which may provide good DC common mode input voltage for the active loop filter, whose input pair may be designed to be LVT (low-threshold voltage) PMOS. In this way, enough headroom may be created.

In one embodiment, current sources 78.1, 78.2 may be constructed using NMOS current mirrors. When there are mismatches between current mirrors, the UP and DN pulses may be skewed because the active loop filter is an integrator and in steady state, has no net current flowing out of the output nodes during one clock cycle for the charge pump. This mechanism may be utilized here to purposely generate an intended skew between the UP and DN pulses. The intended time skew may be reflected as a current adjustment ΔI. Here, ΔI may be the tunable current injection 66 that may be adjusted either automatically or manually by a user.

Embodiments of the present invention may include various charge pumps that include adjustable bias currents. For example, there may be different circuitries to connect the voltage supply 81 to the output nodes 80.1, 80.2. FIG. 4B is a charge pump according to an alternative embodiment of the present invention that includes current sources 75.1, 75.2 that connects voltage supply 81 to output nodes 80.1, 80.2. As shown in FIG. 4B, MOS transistors 70.1, 70.2 of FIG. 4A may be replaced by current sources 75.1, 75.2 that provide fixed current to the output nodes 80.1, 80.2 and resistors 72.1, 72.2 of FIG. 4A may be replaced by a common mode feedback circuit (CMFB) 73 that may have a first input coupled to the first output node 80.1 and a second input coupled to the second output node 80.2. In one embodiment, CMFB 73 may be the resistor pair 72.1, 72.2, or alternatively, CMFB may be an amplifier that outputs the difference signal between its two input terminals. The output of CMFB 73 may be coupled to the control terminals of the current sources 75.1, 75.2 of FIG. 4B. The current sources 75.1, 75.2 may be the PMOS devices as shown in FIG. 4A, or alternatively, NMOS devices. FIG. 4C is a charge pump according to another alternative embodiment of the present invention to construct the bottom half of the circuit. As shown in FIG. 4C, the current sources 78.1, 78.2 may be split into two parts in which the first part may include the current source I and a second part ΔI. The first part (I) of the current sources 78.1, 78.2 may be switchably connected to the first and second output nodes via switches 74.1, 74.2, 76.1, 76.2. Additionally, the second part (Δ) of the current source may be directly coupled to the first and second output nodes, respectively.

Figure 5:
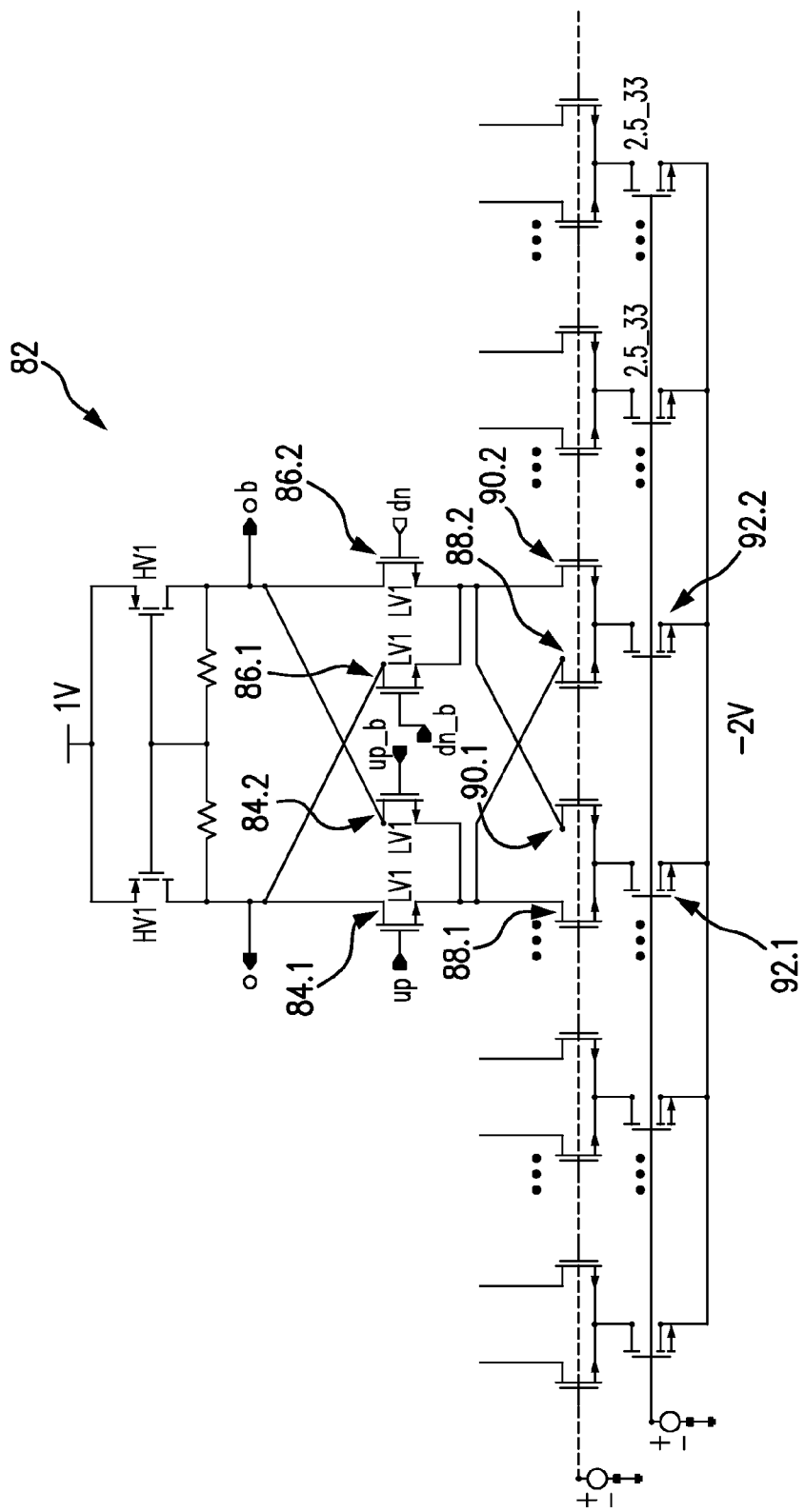
FIG. 5 illustrates a detailed schematic of a charge pump according to an embodiment of the present invention.

The current from the NMOS current mirrors may be divided into multiple branches, in which the current direction of each branch may be steered by a cascode switching pair. As shown in FIG. 5, the charge pump 82 may include NMOS switches 84.1, 84.2 controlled by UP pulses and NMOS switches 86.1, 86.2 controlled by DN pulses. FIG. 5 is a charge pump 82 that includes multiple branches of current mirrors according to an embodiment of the present invention. The current sources of the charge pump may be a plurality of current mirror branches that are connected in parallel. Each branch may include a large NMOS bias device and a pair of NMOS cascode switching devices, as in this embodiment, NMOS transistors 88.1, 90.1, 92.1 that may form a first current branch that includes a first leg (NMOS 88.1) that steers a current to the switches 84.1, 84.2 and a second leg (NMOS 90.1) that steers a current to the switches 86.1, 86.2. The sources of NMOS 88.1, 90.1 may be coupled to NMOS 92.1. The cascode switching pair in each branch may be independently digitally controlled. In this embodiment, the gates of NMOS 88.1, 90.1 may be digitally controlled by a digital code B, to be connected to either a cascode bias voltage or a turn-off voltage. Based on the digital code B, the direction of this single current branch may be selected so that the current may be drained from either UP or DN branches, thus creating a tunable current injection to the DLL. In this way, a DAC is in essence incorporated into the charge pump.

Figure 6:
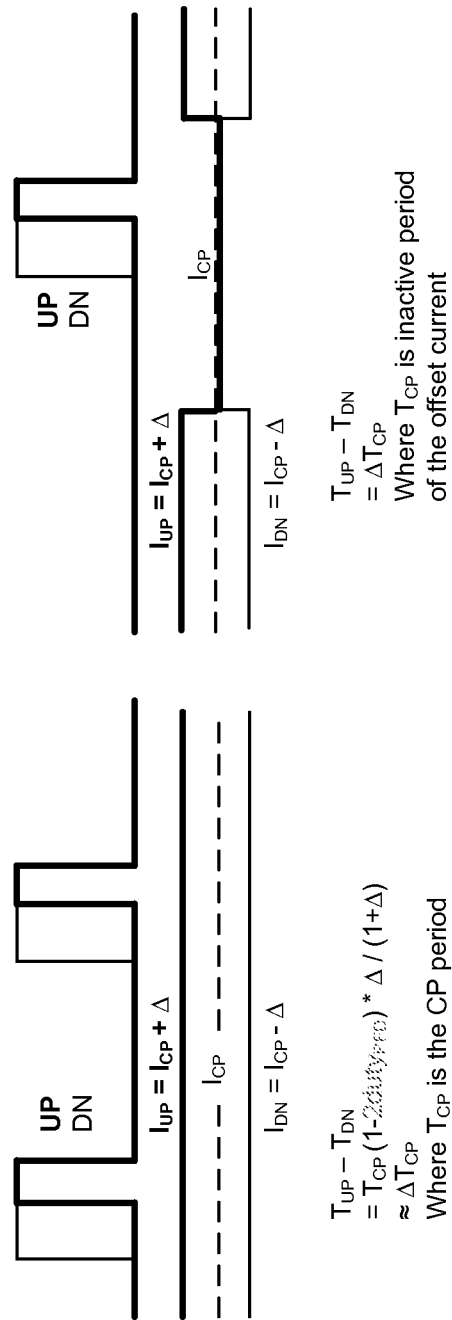
FIGS. 6A-6B illustrate generated clock skews according to embodiments of the present invention.

The purpose of having the DAC is to translate the timing problem into a current matching problem. The minimum pulse widths resulting from the propagation delays in the PFD 60 are dependent on process voltage temperature (PVT). If the offset current is kept constant, the intentionally generated skews depend on PVT, which is undesirable. FIG. 6A illustrates such a PVT dependency for the skew. The reason is that the switching of the charge pump is coupled with the offset current.

Measures may be taken to decouple the switching of the charge pump and the offset current. In one embodiment, a signal generator (not shown) may generate a clock signal to activate or deactivate the charge pump offset current. FIG. 6B shows that the offset current (the tunable current injection ΔI) is turned off during UP and DN pulses. As shown in FIG. 6B, the UP and DN pulses may occur during the time when the charge pump DAC is deactivated, which may greatly mitigate the PVT dependency.

Figure 7:
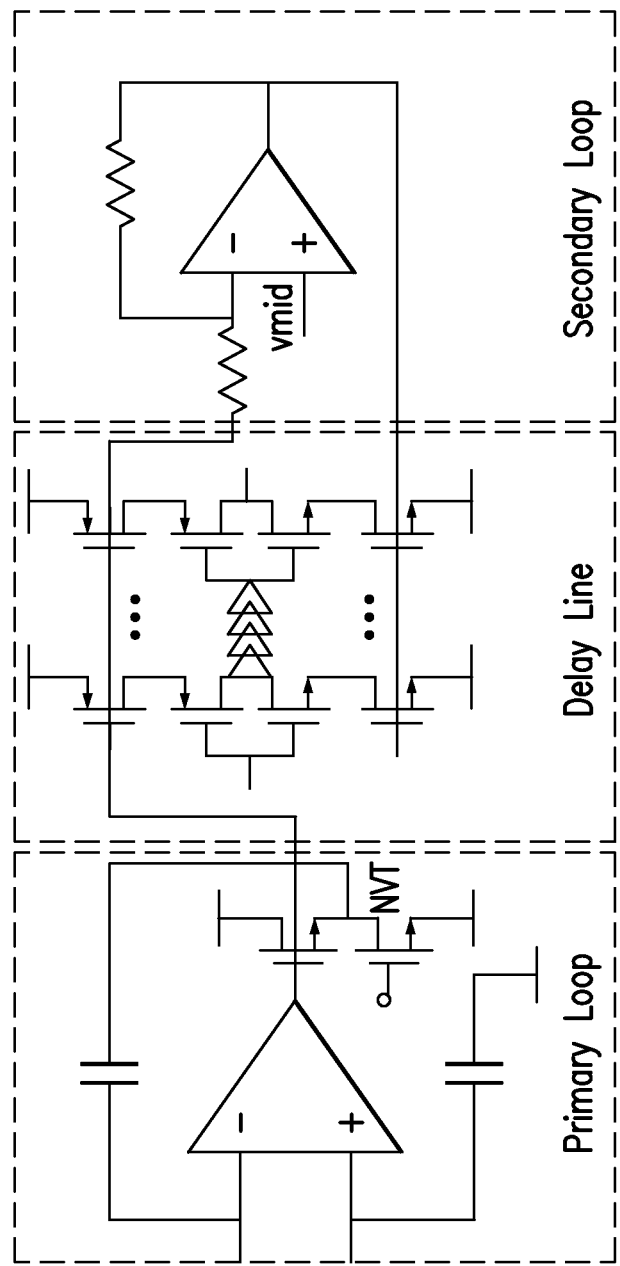
FIG. 7 illustrates a delay element that is biased by dedicated active filter loops according to an embodiment of the present invention.

The delay line 52 may include both PMOS and NMOS devices that are current starved to maximize the tuning range for the offset current. Current art uses one simple bias scheme to provide biases to both PMOS and NMOS devices. In one embodiment, the PMOS and NMOS devices of the delay line 52 may respectively have dedicated bias. In this way, the PMOS devices and the NMOS devices may have substantially equal amount of work load. FIG. 7 is a delay line that has respective dedicated biases for PMOS devices and NMOS devices according to an embodiment of the present invention. As shown in FIG. 7, a primary loop provides a first dedicate bias to all of the PMOS devices in the delay line 52, and a secondary loop provides a second dedicated bias to all of the NMOS devices in the delay line 52. In this way, the PMOS and NMOS devices may have separate biases.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A charge pump for converting at least one of: a phase and a frequency difference into a control voltage, the charge pump comprising:
    a first current component coupled between a voltage supply and a first output node;
    a second current component coupled between the voltage supply and a second output node, a control node of the first current component being coupled to a control node of the second current component;
    a common mode feedback circuit including a first input coupled to the first output node, a second input coupled to the second output node, and an output coupled to the control nodes of the first and second components;
    wherein a first bias current source supplies a first tunable bias current directly to the first output node and switchably supplies a first constant bias current to the first and second output nodes, and a second bias current source supplies a second tunable bias current directly to the first output node and switchably supplies a second constant bias current to the first and second output nodes.

2. The charge pump of claim 1, wherein the first and second tunable bias currents are of a substantially same magnitude but substantially opposite directions.

3. The charge pump of claim 1, wherein the first and second current components include one of a p-type MOSFET (PMOS) and an n-type MOSFET (NMOS).

4. The charge pump of claim 1, wherein the common mode feedback circuit includes:
    a first resistor coupled between the first output node and a gate of the first current component; and
    a second resistor coupled between the second output node and a gate of the second current component.

5. The charge pump of claim 1, wherein the common mode feedback circuit includes an amplifier.

6. The charge pump of claim 1, wherein the first and second bias current sources are connected directly to the output nodes.

7. A charge pump for converting a phase and/or frequency difference into a control voltage, the charge pump comprising:
    a first current component coupled between a voltage supply and a first output node;
    a second current component coupled between the voltage supply and a second output node, a control node of the first current source component being coupled to a control node of the second current source component; and
    a common mode feedback circuit including a first input coupled to the first output node, a second input coupled to the second output node, and an output coupled to the control nodes of the first and second current source components;
    wherein a first bias current source supplies a first adjustable bias current to the first and second output nodes, and a second bias current source supplies a second adjustable bias current to the first and second output nodes.

8. The charge pump of claim 7, further comprising:
    a first switch coupled between the first bias current source and the first output node;
    a second switch coupled between the first bias current source and the second output node;
    a third switch coupled between the second bias current source and the first output node; and
    a fourth switch coupled between the second bias current source and the second output node.

9. The charge pump of claim 7, wherein the first offset current is turned off before the first pulse occurs, the second offset current is turned off before the second pulse occurs, and the first and second offset currents are tunable only when both the first and second pulses are off.

10. The charge pump of claim 7, wherein the first and second current source components include one of a p-type MOSFET (PMOS) and an n-type MOSFET (NMOS).

11. The charge pump of claim 7, wherein the common mode feedback circuit includes an amplifier.

12. The charge pump of claim 7, wherein the common mode feedback circuit includes:
    a first resistor coupled between the first output node and a gate of the first current component; and
    a second resistor coupled between the second output node and a gate of the second current component.

13. A charge pump comprising:
    a fixed current component coupled between a voltage supply and a pair of output nodes;
    a common mode bias circuit coupled to the fixed current component and the pair of output nodes;
    a switching structure coupled to the output nodes; and
    a pair of tunable offset current sources coupled to the switching structure.

14. The charge pump of claim 13, wherein the pair of tunable offset current sources switchably supplies a bias current to the pair of output nodes.

15. The charge pump of claim 13, wherein the pair of tunable offset current sources is directly coupled to the output nodes.

* * * * *